United States Patent
Petrarca et al.

(10) Patent No.: US 6,268,261 B1
(45) Date of Patent: Jul. 31, 2001

(54) MICROPROCESSOR HAVING AIR AS A DIELECTRIC AND ENCAPSULATED LINES AND PROCESS FOR MANUFACTURE

(75) Inventors: Kevin S. Petrarca, Newburgh; Rebecca D. Mih, Wappingers Falls, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/185,185

(22) Filed: Nov. 3, 1998

(51) Int. Cl.[7] .................... H01L 21/76; H01L 21/4763
(52) U.S. Cl. .................... 438/421; 438/619; 438/422; 438/411
(58) Field of Search .................... 438/422, 421, 438/619, 622, 411, 412, 461

(56) References Cited

U.S. PATENT DOCUMENTS

| | | | |
|---|---|---|---|
| 4,189,760 | 2/1980 | Marshall | 361/321 |
| 5,231,558 | 7/1993 | Tatsuta | 361/321 |
| 5,311,651 | 5/1994 | Kim et al. | 29/25.42 |
| 5,424,906 | 6/1995 | Kishishita et al. | 361/298.1 |
| 5,444,015 * | 8/1995 | Aitken et al. | 437/182 |
| 5,459,633 | 10/1995 | Kosslowski et al. | 361/304 |
| 5,461,003 * | 10/1995 | Havermann et al. | 437/187 |
| 5,638,251 | 6/1997 | Goel et al. | 361/313 |
| 5,736,448 | 4/1998 | Saia et al. | 438/393 |
| 5,872,052 * | 2/1999 | Iyer | 438/622 |
| 5,953,626 * | 9/1999 | Hause et al. | 438/622 |
| 6,057,202 * | 5/2000 | Chen et al. | 438/381 |
| 6,057,226 * | 5/2000 | Wong | 438/623 |
| 6,071,805 * | 6/2000 | Liu | 438/619 |

* cited by examiner

Primary Examiner—Richard Elms
Assistant Examiner—Adam Pyonin
(74) Attorney, Agent, or Firm—Ratner & Prestia; Jay H. Anderson, Esq.

(57) ABSTRACT

A process for manufacturing a semiconductor circuit. The process comprises creating a plurality of adjacent conductive lines having a solid fill between the conductive lines; creating one or more layers above the lines and the fill; creating one or more pathways to the fill through the layers; and converting the fill to a gas that escapes through the pathways, leaving an air void between adjacent lines. To protect the lines from oxidation during processing, a related process for encapsulating conductive lines in one or more adhesion-promotion barrier layers may be performed. The encapsulation process may also be practiced in conjunction with other semiconductor manufacturing processes. The processes result in a multi-layer semiconductor circuit comprising conductive lines, wherein the lines have air as a dielectric between them, are encapsulated by an adhesion-promotion barrier layer, or both.

23 Claims, 6 Drawing Sheets

MICROPROCESSOR HAVING AIR AS A DIELECTRIC AND ENCAPSULATED LINES AND PROCESS FOR MANUFACTURE

TECHNICAL FIELD

The present invention relates generally to microprocessors and, more specifically, to microprocessors having encapsulated conductive lines, air as a dielectric between those lines, or both encapsulated conductive lines and air as a dielectric. The present invention also relates to a process for the manufacture of such microprocessors.

BACKGROUND OF THE INVENTION

As semiconductor microprocessor circuit densities increase, dimensions are continuously being reduced. One challenge presented by this reduction is finding materials with a low dielectric constant that can be used between the metal lines or structures that comprise the various levels of a semiconductor circuit. As the dielectric constant of such materials is decreased, the speed of performance of the semiconductor product is increased. The theoretical minimum dielectric constant is E=1 (vacuum).

The dielectric constant is an important consideration, because the capacitance between current-carrying metal lines increases as circuit densities increase. Capacitance in semiconductor passive wiring can be estimated by a simple parallel plate capacitor equation:

$$C = E \times A / D,$$

in which

C=capacitance;

E=the dielectric constant of the material between capacitor plates relative to the dielectric constant in a vacuum;

A=the area of the capacitor; and

D=the distance separating the plates of the capacitor.

The capacitance of a circuit affects the speed of a device. Speed is dependent on the product (RC) of the resistance (R) and the capacitance (C), known as the "RC time constant." As the capacitance increases, the time constant increases, and therefore the circuit slows down.

Referring now to FIGS. 1 and 2, there is shown an exemplary semiconductor circuit having metal lines 510 and 512 with a distance "D" between the metal lines 510 and 512. As circuit densities increase, the distance D decreases to a value that may be less than 1 μm. The area "A" (not shown) is the area of the line, bounded by the line height "H" and the line length "L," and is typically in units of square microns. E (not shown) is the dielectric constant of the material 514 separating the two metal lines 510 and 512. If the material 514 is silicon dioxide, a material typically used in the art, the dielectric constant E is approximately 4.2. As circuit densities increase, it is desirable to counteract the decrease in the distance D with a decrease in the dielectric constant E, so that the capacitance C can be minimized.

It is also known in the semiconductor industry to apply an adhesion-promotion layer such as silicon oxide, silicon nitride, titanium, tungsten, or related compounds, before a metal deposition. The adhesion-promotion layer is often used as a barrier for metal migration. Typical methods of application for adhesion-promotion or barrier layers, however, only cover five out of the six surfaces of a three-dimensional trough or metal line.

The deficiencies of the conventional microprocessors and semiconductor processes used to manufacture such devices show that a need still exists for an improved microprocessor and process of manufacture. To overcome the shortcomings of the conventional devices and processes of manufacture, a new microprocessor and process of manufacture are provided. An object of the present invention is to create three-dimensional, multi-level semiconductor circuits using air as the dielectric material. A related object is to overcome the conventional problems (e.g., air is not a load-bearing substance like other dielectrics) which have prevented use of air as a dielectric material in semiconductor processes.

Still another object of the present invention is to provide a process which can be completed without destroying the structure during manufacturing. A more specific object is to avoid deterioration of the conductive metals, such as copper, used to form conductive lines. Yet another object is to prevent metal migration during anneal process steps.

It is another object of the present invention to encapsulate all six surfaces of a three-dimensional trough or metal line. In addition, a related object for the encapsulation process of the present invention is to provide for the top surface of the encapsulating layer to be planar with the top surface of surrounding fill.

SUMMARY OF THE INVENTION

To achieve these and other objects, and in view of its purposes, the present invention provides a process for manufacturing a microprocessor. The process comprises creating a plurality of adjacent structures having a solid fill between the structures; creating one or more layers above the structures and the fill; creating one or more pathways to the fill through the layers; and converting the fill to a gas that escapes through the pathways, leaving an air void between the adjacent structures.

In accordance with the present invention, there is also provided a process for manufacturing a microprocessor on a substrate, the process comprising the steps of:

a) creating a plurality of conductive lines having fill between the lines, each line having a top surface and one or more lower adhesion-promotion barrier layers underneath and between each line and the fill adjacent to the line, and the fill having a top surface;

b) expanding the fill to raise the fill top surface higher than the conductive line top surface;

c) applying one or more upper adhesion-promotion barrier layers over the fill top surface and over the conductive line top surface; and d) removing the upper adhesion-promotion barrier layers except over the conductive line top surface, leaving each conductive line encapsulated by the upper and lower adhesion-promotion barrier layers.

The above processes may be combined to produce a multi-layer semiconductor circuit comprising conductive lines having air as a dielectric between the lines. Each line has six sides and each side is encapsulated by an adhesion-promotion barrier layer. It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying figures. It is emphasized that, according to common practice, the various features of the figures are not to scale. On the contrary, the dimensions of the various features are arbitrarily expanded or reduced for clarity. Included in the figures are the following figures.

DETAILED DESCRIPTION OF THE INVENTION

Figure 1:
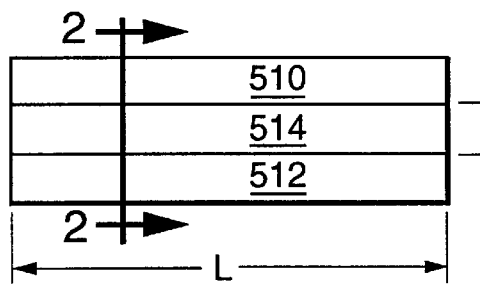
FIG. 1 is a schematic illustration of a top view of an exemplary semiconductor circuit of the prior art.
Figure 2:
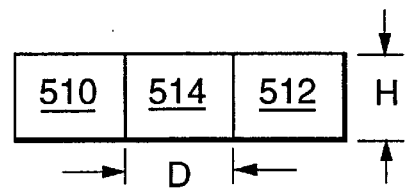
FIG. 2 schematic illustration of a cross-sectional view of the exemplary semiconductor circuit of FIG. 1, taken along the line 2—2.
Figure 3:
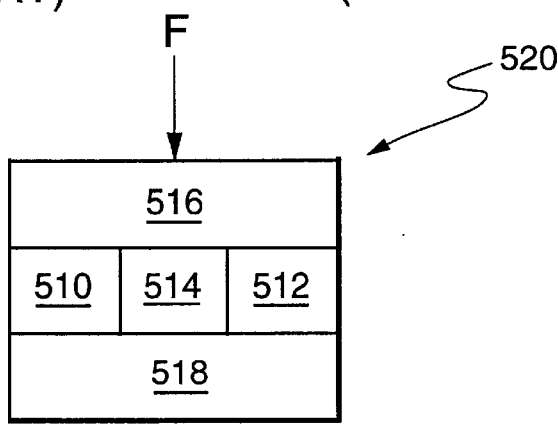
FIG. 3 is a schematic illustration of a cross-sectional view of the exemplary semiconductor circuit of FIG. 1, including a substrate and a cap layer, being subjected to a force F.

Referring to the drawing, wherein like reference numerals refer to like elements throughout, FIG. 3 shows a semiconductor structure 520 comprising metal lines 510 and 512 having dielectric 514 between the metal lines 510 and 512. Metal lines 510 and 512 and dielectric 514 are disposed upon a substrate 518. As illustrated in FIG. 3, a top cap layer 516, which may be a dielectric layer, is being subjected to a force "F," such as the force of a mechanical polishing step.

In the quest for a reduced dielectric constant, the fundamental minimum dielectric constant is a vacuum (E=1). The dielectric constant of air (E=1.0001) is sufficiently close, however, to this fundamental minimum for practical purposes. Therefore, the present invention comprises using air as a dielectric for material 514. The goal of creating three-dimensional, multi-level semiconductor circuits such as semiconductor structure 520 using air as the dielectric material 514 is difficult to achieve because of the mechanical stresses that the semiconductor structure must withstand during processing without being destroyed. For instance, typical semiconductor processes include polishing methods that may apply a force F of 1 to 5 pounds per square inch or greater on substrate surfaces. Air is not a load-bearing substance like other dielectrics, such as silicon dioxide, and thus has previously been considered unsuitable as a dielectric in semiconductor processes.

Figure 4:
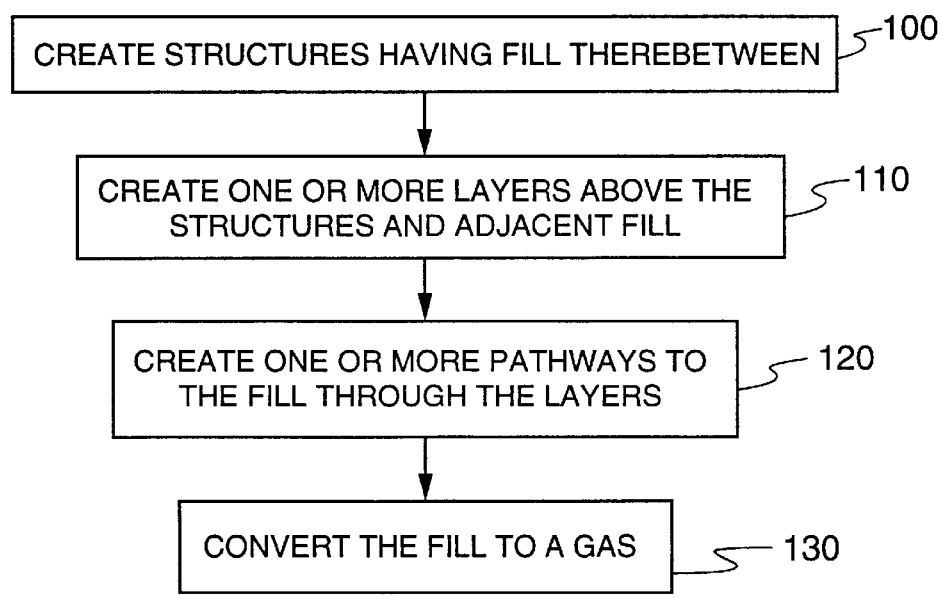
FIG. 4 depicts a flowchart of a general exemplary process for creating air voids between structures in a semiconductor circuit according to the present invention.
Figure 12:
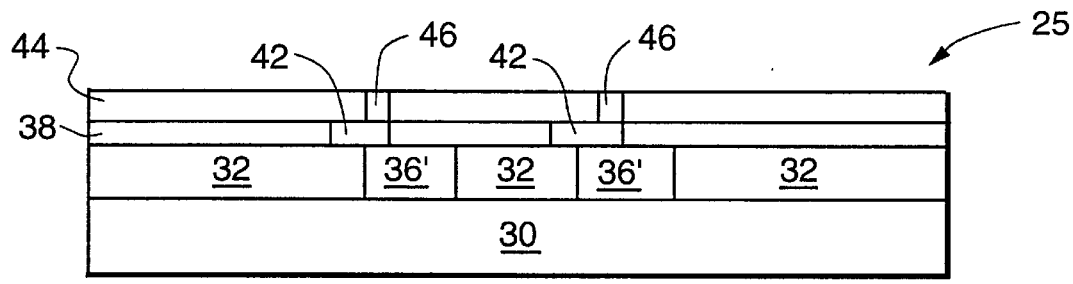

Therefore, the process of the present invention is directed to manufacturing a multi-layer semiconductor circuit having air as the dielectric between lines. The process avoids destroying the structure during manufacturing. Referring now to FIGS. 4 and 12, there is shown a flowchart of the process, and a cross-sectional view illustrating a multi-layer semiconductor circuit undergoing the process, respectively.

The process for making the multi-layer semiconductor circuit 25 as shown in FIG. 12 generally comprises first, at step 100, creating a plurality of adjacent structures, such as conductive lines 36', having a hard, removable fill 32, such as amorphous carbon, between the lines 36'. The lines 36' and fill 32 are disposed on a substrate 30. Then, at step 110, one or more layers 38 and 44 are created above lines 36' and fill 32. At step 120, one or more pathways (via 46 through layer 44 and patch 42 through layer 38) are created through the layers to the fill 32. Finally, at step 130, the fill 32 is converted to a gas that escapes through the pathway (via 46 through patch 42), leaving a void between adjacent lines 36'. If fill 32 is amorphous carbon, fill 32 is heated in the presence of oxygen to oxidize the carbon to a carbonaceous gas.

Figure 5:
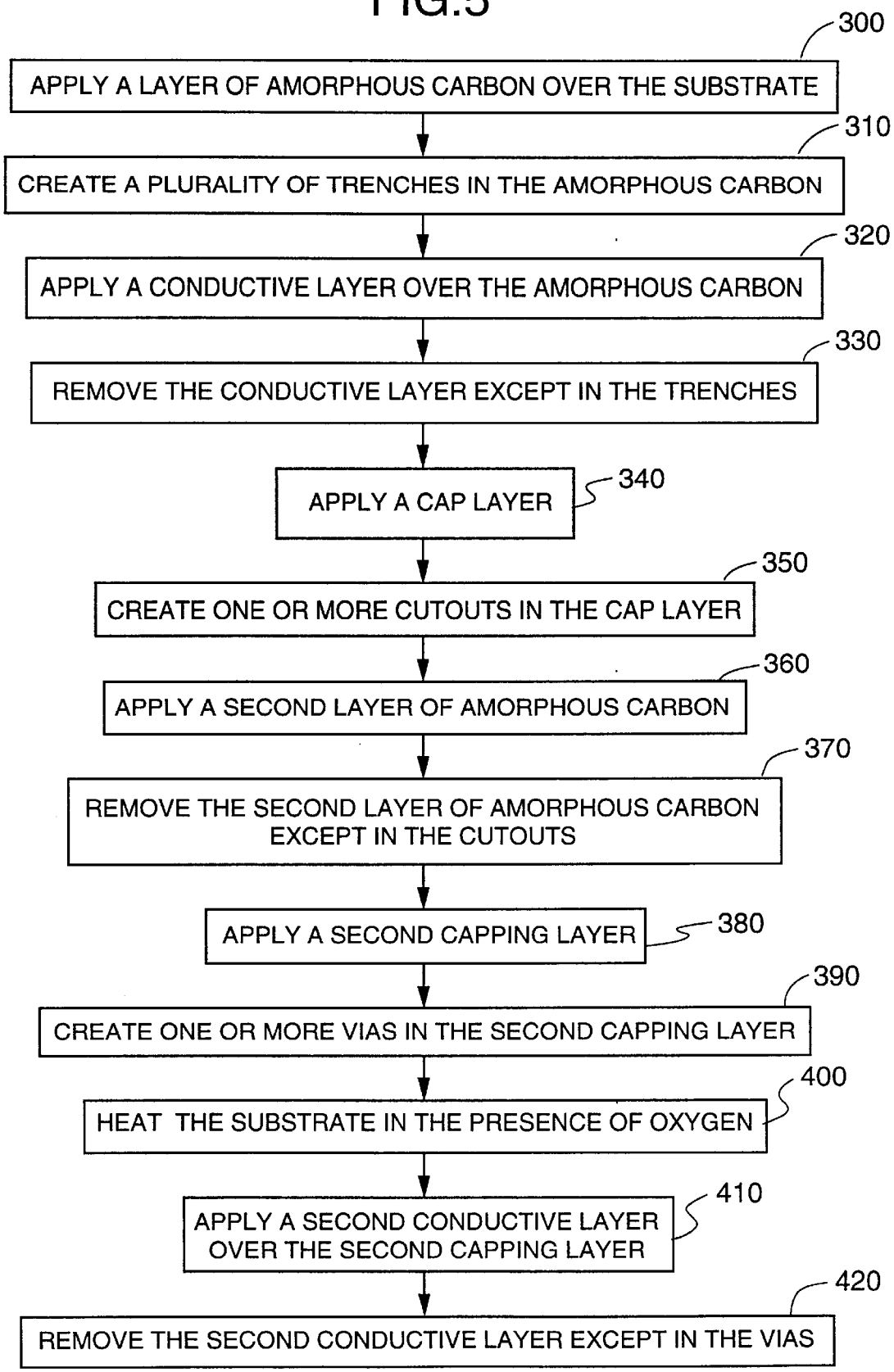
FIG. 5 depicts a flowchart of a more specific exemplary process for creating air voids between conductive lines according to the present invention.

More specifically, the process of the present invention may be best understood with reference to the flowchart of FIG. 5 and the cross-sectional illustrations of FIGS. 6 through 14. These illustrations show multi-layer semiconductor circuit 25 as it is being manufactured in accordance with the invention.

Figure 6:
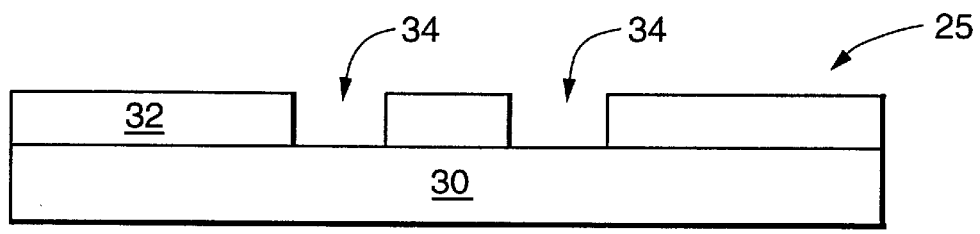
FIGS. 6 through 14 are schematic illustrations of a cross-sectional view of an exemplary multilevel semiconductor circuit, illustrating the process of the present invention as depicted by the flowchart of FIG. 5.

First, at step 300, a layer of amorphous carbon fill 32 is applied over a substrate 30, as shown in FIG. 6, typically by chemical vapor deposition (CVD). Substrate 30 may be composed of a single compound such as silicon, or a multi-layer stack including silicon phosphoro-silicate, glass, or other materials. At step 310, a plurality of trenches 34 are created in the amorphous carbon fill 32. For example, the trenches 34 may be created by first applying a photoresist (not shown) over amorphous carbon fill 32, exposing the photoresist in the desired pattern, developing the photoresist, and exposing the in-process semiconductor circuit 25 to a reactive ion etching (RIE) step, as is well-known in the art.

Figure 7:
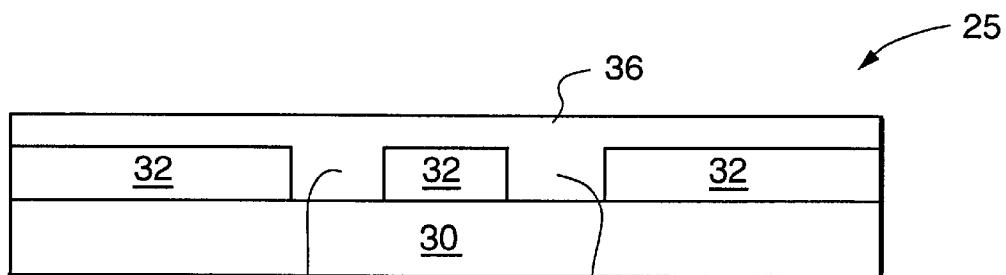
Figure 8:
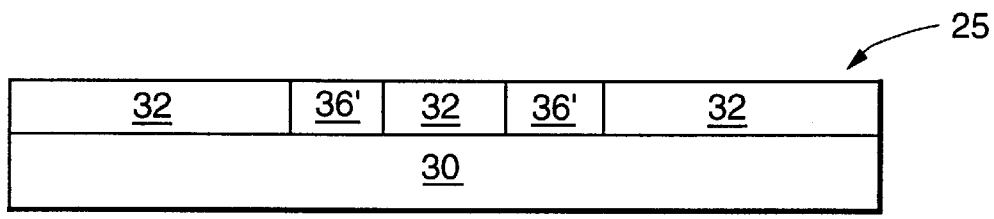

Next, at step 320, the process comprises applying a conductive layer 36 over the amorphous carbon fill 32, filling the trenches 34, as shown in FIG. 7. Next, at step 330, the conductive layer 36 is removed, except in the trenches 34, by etching, chemical mechanical polishing (CMP), or any method known in the art. Thus, step 330 leaves a plurality of conductive lines 36' having amorphous carbon fill 32 between the lines 36', as shown in FIG. 8.

Figure 9:
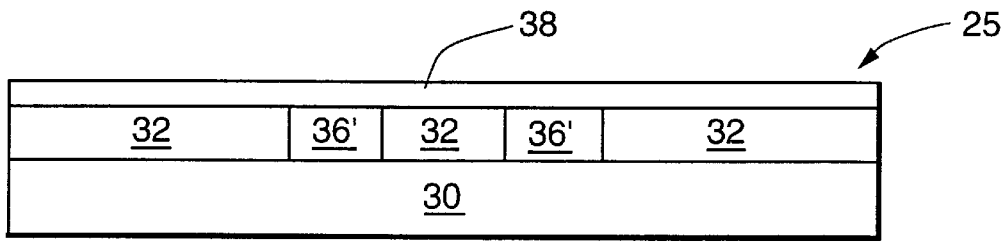
Figure 10:
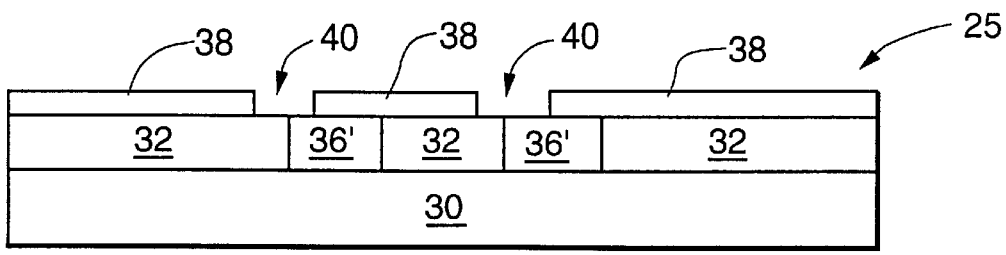

At step 340, a cap layer 38, such as silicon nitride, is applied, such as by CVD, over conductive lines 36' and fill 32, as shown in FIG. 9. Next, at step 350, one or more cutouts 40 are created in the cap layer 38, each cutout 40 exposing a portion of one of the conductive lines 36' and a portion of the amorphous carbon fill 32 adjacent to the lines 36', as shown in FIG. 10. The cutouts 40 may be created by a fluorine-based RIE step, or any method well-known in the art.

Figure 11:
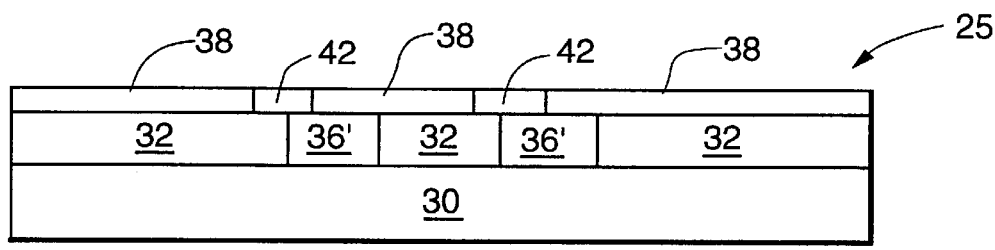

Next, at step 360, a second layer of amorphous carbon is applied over the cap layer 38, filling the cutouts 40. At step 370, the second layer of amorphous carbon is removed, such as by CMP, except in the cutouts 40, leaving patches 42 of amorphous carbon within cap layer 38. The structure at this point in the process of the present invention is shown in FIG. 11.

A second capping layer 44 covering the first capping layer 38 and the patches 42 is applied, at step 380. At step 390, one or more vias 46 are created in the second capping layer 44. One via 46 is created over each patch 42, each via 46 penetrating to the patch 42 in the portion of the patch 42 that is over one of the conductive lines 36', as shown in FIG. 12. A standard fluorine-based RIE process, or any method known in the art, may create these vias 46.

Figure 13:
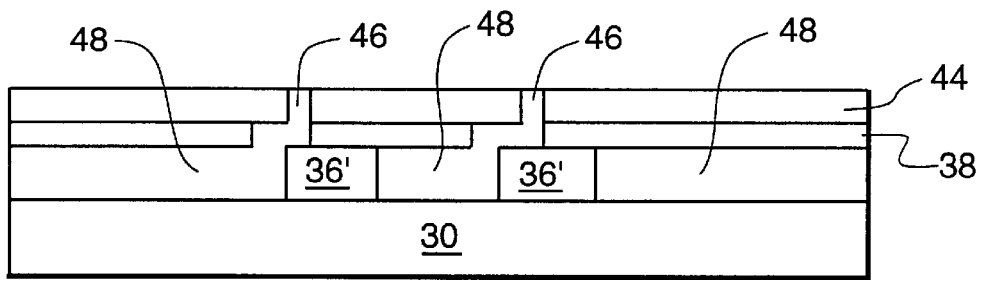

Finally, at step 400, the substrate 30 is heated in the presence of oxygen to oxidize the amorphous carbon fill 32 and patch 42 to a carbonaceous gas that escapes through each of the vias 46, leaving air voids 48 between adjacent conductive lines 36', as shown in FIG. 13. The heating step is typically conducted in the presence of oxygen, usually in an anneal chamber into which oxygen is metered, at a temperature greater than about 100° C, preferably about 400° C, for 2 to 6 hours, preferably about 4 hours.

Vias 46 create an exhaust pipe structure vertically through the stack of materials that allows the carbonaceous gas to escape without causing excessive pressure buildup in the void 48 as the void 48 is formed. The placement of vias 46 above only the portion of patch 42 over conductive line 36' allows the opening to be filled during subsequent process steps. Thus, only minimal depressions may remain in subsequent layers corresponding to the vias 46.

Figure 14:
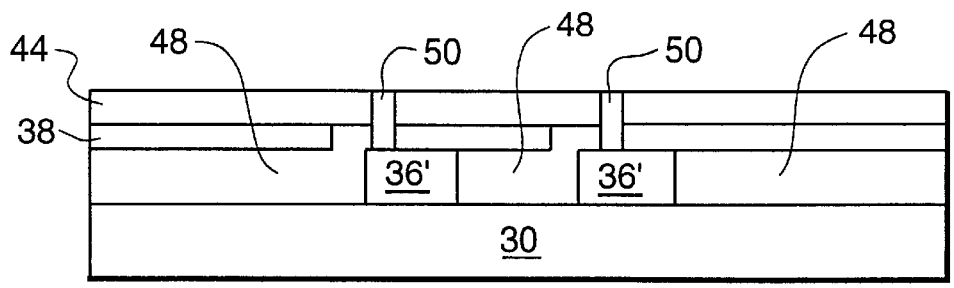

Optionally, the process of the present invention may continue at step 410 by applying a second conductive layer over second cap layer 44, filling vias 46. At step 420, the second conductive layer is removed, such as by etching or CMP, except in the vias 46, leaving plugs 50 as shown in FIG. 14. The offset placement of the vias 46 only over the conductive lines 36' prevents the metal from filling into the air voids 48 and shorting the conductive lines 36'.

The resulting structure of semiconductor circuit 25 in FIG. 14 is planar and also able to bear substantial loads. Thus, repetition of the same process steps above allows multiple levels to be built upon the structure, each level using air as a dielectric, if desired.

The oxidation steps necessary to remove the amorphous carbon in the process of the present invention may cause deterioration of some conductive metals, such as copper, used to form the conductive lines 36'. Therefore, the present invention may also comprise a method for encapsulating all surfaces of a metal structure with barrier layers. The barrier layers allow subsequent processing while inhibiting any damage that would be caused under normal process conditions. Encapsulation also prevents metal migration during subsequent anneal steps. To ensure adherence both to metal and insulator materials, the use of multiple layers—a barrier layer and an adhesion layer—may be required.

Although typical methods of application for adhesion-promotion or barrier layers only cover five of the six surfaces of a three-dimensional trough or metal line, the encapsulation process of the present invention allows all sides to be encapsulated. In addition, the encapsulation process of the present invention provides for the encapsulating layer top surface to be planar with the top surface of surrounding fill.

Such encapsulated conductive lines may be useful not only with the invention of using air as a dielectric between conductive lines, but also in other semiconductor processes where the integrity of conductive lines needs protection. So, although illustrated in the following example in the context of the invention using air as a dielectric between lines, the process and structure of encapsulation of a conductive line may be applicable to many semiconductor fabrication processes.

Figure 15:
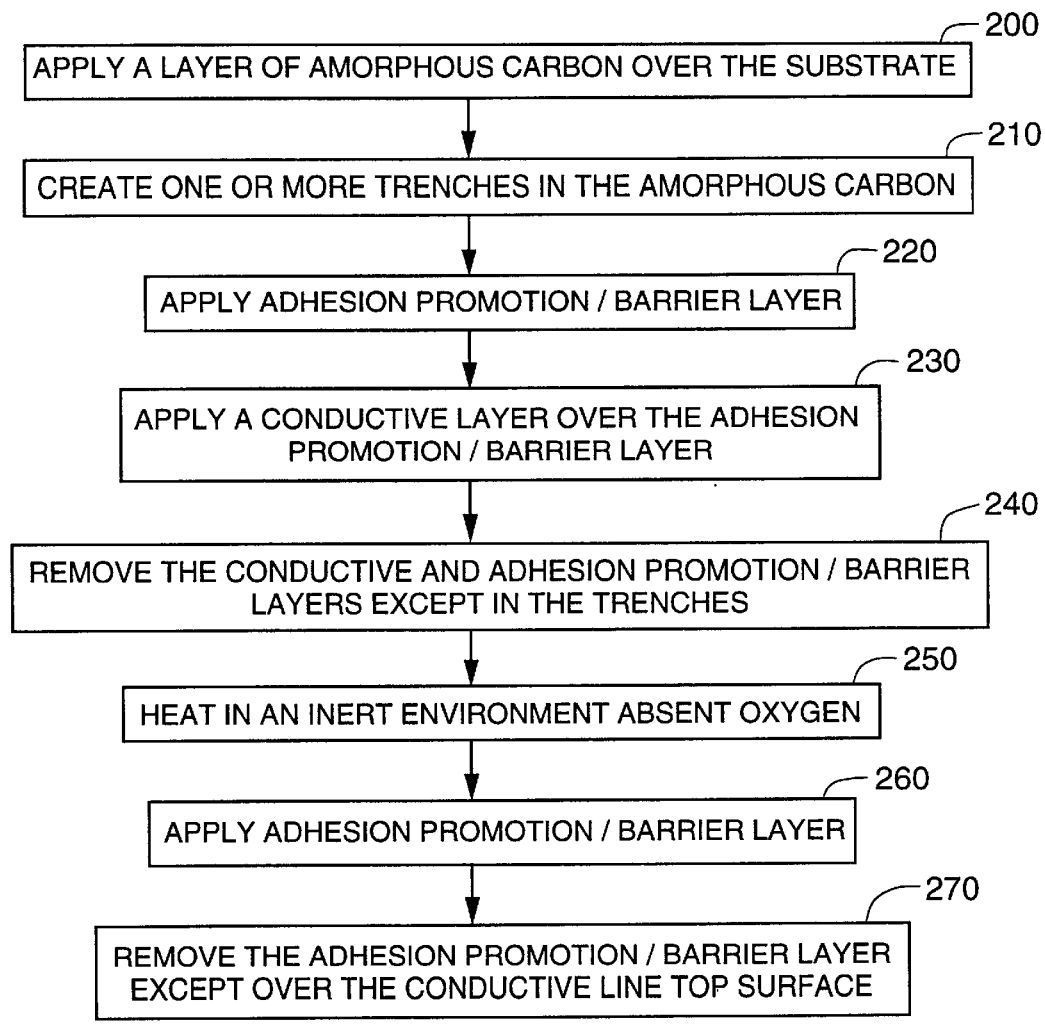
FIG. 15 depicts a flowchart of a exemplary process for creating conductive lines encapsulated by an adhesion-promotion barrier layer.

The encapsulation process of the present invention may be visualized by referring both to the flowchart in FIG. 15 and to the cross-sectional illustrations of FIGS. 6 and 16–21. FIGS. 6 and 16–21 show multi-layer semiconductor circuit 25 as it is being manufactured in accordance with the encapsulation embodiment of the present invention.

Figure 16:
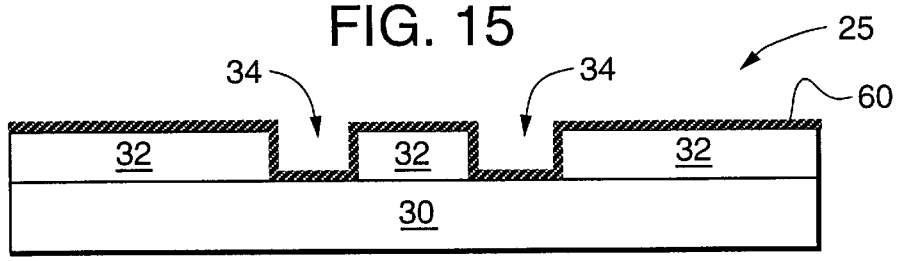
FIGS. 16 through 21 are schematic illustrations of a cross-sectional view of an exemplary multilevel semiconductor circuit, illustrating the process of the present invention as depicted by the flowchart of FIG. 15.

First, as shown in FIG. 6, at step 200 of FIG. 15, a layer of amorphous carbon fill 32 is applied over substrate 30 and, at step 210 of FIG. 15, one or more trenches 34 is or are created, such as by etching or RIE, in the amorphous carbon fill 32. Next, at step 220, one or more adhesion-promotion barrier layers 60 is or are applied, such as by CVD, over the amorphous carbon fill 32 including in the trenches 34, as shown in FIG. 16. Layer 60 may be a single adhesion-promotion barrier layer, or it may be a composite of a separate barrier layer, such as titanium nitride, followed by a separate adhesion-promotion layer, such as titanium tungsten for adhesion to a tungsten metal. The adhesion-promotion layer in the composite is the top layer so that it resides next to the metal layer to follow. Surface treatments commonly known in the art, such as plasma roughening, may also be used to improve the adhesion between layers.

Figure 17:
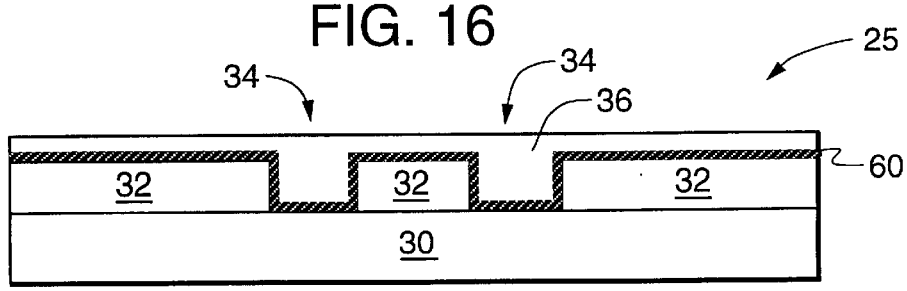
Figure 18:
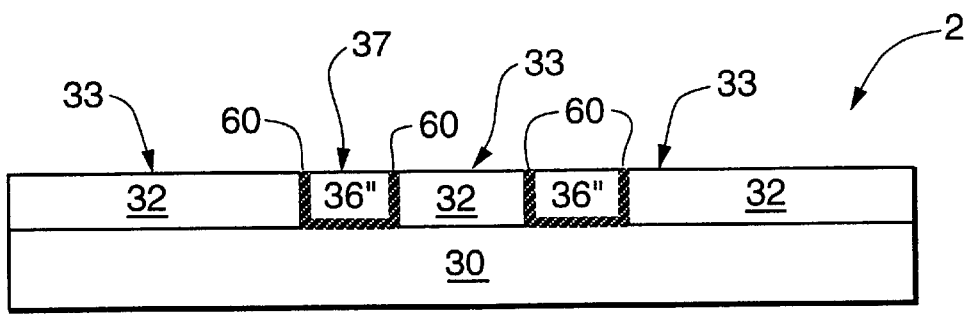

At step 230, a conductive layer 36, such as tungsten, is applied by CVD, sputtering, plating, or any method known in the art over the adhesion-promotion barrier layer 60, filling the trenches 34, as shown in FIG. 17. The process next comprises removing the conductive layer 36 and the adhesion-promotion barrier layer 60 at step 240, by a process such as CMP, except in the trenches 34. Thus, a plurality of conductive lines 36" are created having amorphous carbon fill 32 between conductive lines 36", as shown in FIG. 18. Each line 36" has a top surface 37 and an adhesion-promotion barrier layer 60 both underneath the line 36" and between each line 36" and fill 32 adjacent to the line 36". Fill 32 has a top surface 33. Top surfaces 37 of conductive lines 36" may be slightly dished as a result of a CMP step. This dish will not inhibit the process, however, and may rather improve the final product by increasing the encapsulation thickness.

Although the above steps 200, 210, 220, 230, and 240 are preferred, any method known in the art may be performed to create a plurality of conductive lines 36", each having a top surface and one or more adhesion-promotion barrier layers underneath and between each line and the fill adjacent to the lines 36".

Figure 19:
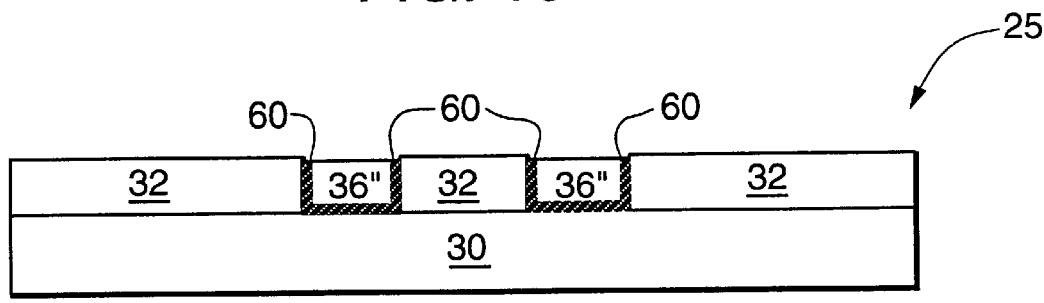

At step 250, the process comprises heating the fill 32 in an inert environment, such as nitrogen or argon, absent oxygen. Generally this heating step is carried out at a temperature of greater than approximately 300° C, in the range of about 375 to about 425° C, preferably about 410° C, for a minimum of approximately 3½ hours. This heating step increases the volume of the amorphous carbon fill 32 and raises the fill top surface 33 higher than the conductive line top surface 37, as shown in FIG. 19. The absence of oxygen in this step is important, because the presence of oxygen might react away the carbon and weaken the mechanical properties of the fill 32. Temperatures approaching or exceeding 500° C may also disintegrate the carbon.

Although the above steps have been described with respect to amorphous carbon that is heated to expand, any dielectric fill capable of expanding, whether upon heating in an inert atmosphere or by some other process, may be used. Furthermore, although a titanium tungsten adhesion-promotion layer and a titanium nitride barrier layer on tungsten metal have been described, other metal systems incorporating other adhesion-promotion, barrier, or both adhesion-promotion and barrier layers may be used.

Figure 20:
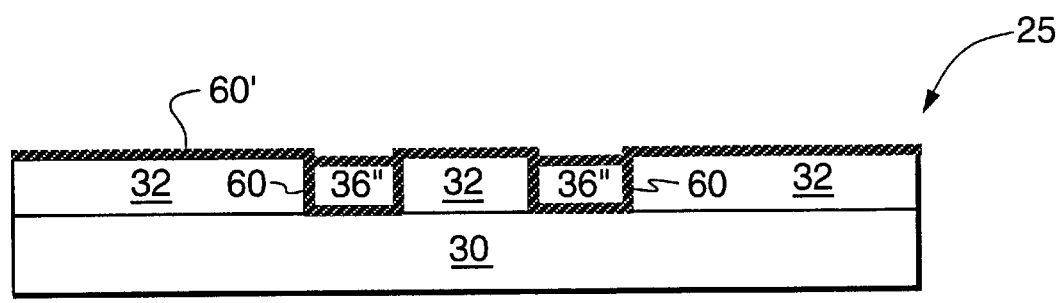

Next, at step 260, another adhesion-promotion barrier layer (or layers) 60' is applied over the top surface 33 of fill 32 and top surface 37 of conductive line 36", respectively, as shown in FIG. 20. Again, layer 60' may be a single adhesion-promotion barrier layer, or it may comprise two distinct layers. This time, however, the adhesion-promotion layer comes first, followed by the barrier layer. This configuration assures that the adhesion-promotion layer is the layer residing next to the metal of the conductive lines 36".

Figure 21:
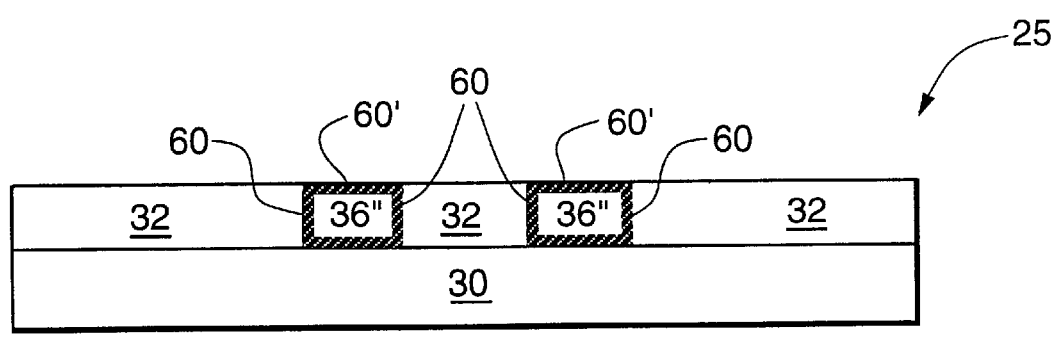

Finally, at step 270, the adhesion-promotion barrier layer 60' is removed, such as by CMP, except over the top surface 37 of the conductive lines 36", leaving each conductive line 36" completely encapsulated by adhesion-promotion barrier layers 60 and 60', as shown in FIG. 21.

When the encapsulation process according to the present invention is practiced in conjunction with the air dielectric process, steps 220, 230, 240, 250, 260, and 270 of the flowchart shown in FIG. 15 are essentially inserted in place of steps 320 and 330 of the flowchart shown in FIG. 5. When practiced independently of the air dielectric process, the amorphous carbon fill 32 may be used as a dielectric in the finished structure, or it may be replaced by a different dielectric. For instance, the structure of semiconductor circuit 25 of FIG. 21 may be heated in the presence of oxygen to oxidize amorphous carbon fill 32 and convert it to a carbonaceous gas that dissipates, leaving only conductive lines 36" on substrate 30. Another dielectric may then be applied and planarized back, leaving a structure essentially identical to that shown in FIG. 21, except that regions of fill 32 now comprise the replacement dielectric rather than amorphous carbon.

Both the air dielectric and the encapsulation processes have been described above with reference to amorphous carbon, because this material is capable of oxidizing to form a gas when heated with oxygen and expanding when heated in an inert atmosphere, respectively. Other materials having similar properties enabling them to convert to a gas or expand may be used, however, with one or both of the processes described. For instance, a solid that sublimates at a threshold temperature to convert to a gas, rather than oxidizing, may be used to create the air voids.

Although illustrated and described above with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A process for manufacturing a microprocessor, the process comprising:
    (a) creating a plurality of adjacent structures having a solid fill between the adjacent structures;
    (b) creating at least one layer above said adjacent structures and said fill;
    (c) creating at least one discrete pathway to said fill through said layer; and
    (d) converting said fill to a gas that escapes through said pathway, leaving an air void between said adjacent structures.

2. The process according to claim 1, wherein said fill comprises amorphous carbon.

3. The process according to claim 2, wherein step (d) comprises heating the amorphous carbon fill in the presence of oxygen at a temperature greater than about 100° C.

4. The process according to claim 3, wherein step (d) comprises said heating at a temperature of about 400° C.

5. The process according to claim 1 wherein step (a) includes creating a plurality of conductive lines.

6. The process according to claim 5 wherein step (a) includes creating a plurality of conductive lines completely surrounded by an adhesion-promotion barrier layer.

7. A process for manufacturing a microprocessor, the process comprising:
    (a) creating a plurality of adjacent structures having a solid fill with a top surface between the adjacent structures, by:
        (i) creating a plurality of conductive lines, each having a top surface and at least one first adhesion-promotion barrier layer underneath each line and between each line and the fill adjacent to each line;
        (ii) expanding said fill to raise the fill top surface higher than the conductive line top surface;
        (iii) applying at least one second adhesion-promotion barrier layer over said fill top surface and said conductive line top surface; and
        (iv) removing said at least one second adhesion-promotion barrier layer except over said conductive line top surface, leaving each conductive line encapsulated by said first and second adhesion-promotion barrier layers;
    (b) creating at least one layer above said adjacent structures and said fill;
    (c) creating at least one pathway to said fill through said layer; and
    (d) converting said fill to a gas that escapes through said pathway, leaving an air void between said adjacent structures.

8. A process for manufacturing a microprocessor on a substrate, the process comprising:
    (a) applying a first layer of amorphous carbon over the substrate;
    (b) creating a plurality of trenches in said first layer of amorphous carbon;
    (c) applying a first conductive layer over said first layer of amorphous carbon and in said trenches;
    (d) removing said first conductive layer except in said trenches, leaving a plurality of conductive lines, one in each trench, having amorphous carbon between said conductive lines;
    (e) applying a first cap layer,
    (f) creating one or more cutouts in said first cap layer, each cutout creating an opening that exposes a portion of one of said conductive lines and a portion of said first layer of amorphous carbon adjacent to the conductive lines;
    (g) applying a second layer of amorphous carbon over said first cap layer, filling said cutouts;
    (h) removing said second layer of amorphous carbon except in said cutouts, leaving patches of amorphous carbon in said cutouts;
    (i) applying a second cap layer over said first cap layer and over said patches;
    (j) creating one or more discrete vias in said second cap layer, one over each patch, each via penetrating to the patch in the portion of the patch over the conductive line; and
    (k) heating said substrate in the presence of oxygen to oxidize the amorphous carbon to a carbonaceous gas that escapes through each of said vias, leaving air voids between adjacent conductive lines.

9. The process according to claim 8, wherein step (k) comprises heating the substrate at a temperature greater than about 100° C.

10. The process according to claim 9, wherein step (k) comprises heating the substrate at a temperature of about 400° C.

11. The process according to claim 8 further comprising the step of:
    (l) applying a second conductive layer over said second cap layer and in said vias; and
    (m) removing said second conductive layer except in said vias.

12. A process for manufacturing a microprocessor on a substrate, the process comprising the steps of:
(a) creating a plurality of conductive lines having fill between the conductive lines, each conductive line having a top surface and at least one lower adhesion-promotion barrier layer underneath each line and between each line and the fill adjacent to each line, the fill having a top surface;
(b) expanding said fill to raise the fill top surface higher than the conductive line top surface;
(c) applying at least one upper adhesion-promotion barrier layer over said fill top surface and over said conductive line top surface; and
(d) removing said at least one upper adhesion-promotion barrier layer except over said conductive line top surface, leaving each conductive line encapsulated by said upper and lower adhesion-promotion barrier layers.

13. The process according to claim 12, wherein said fill comprises amorphous carbon and step (a) includes the steps of:
(i) applying over the substrate a layer of amorphous carbon;
(ii) creating one or more trenches in said amorphous carbon;
(iii) applying at least one lower adhesion-promotion barrier layer over said amorphous carbon including in said trenches;
(iv) applying a conductive layer over said at least one lower adhesion-promotion barrier layer and in said trenches; and
(v) removing said conductive layer and said at least one lower adhesion-promotion barrier layer except in said trenches;
and wherein expanding said fill in step (b) comprises heating said amorphous carbon in an inert atmosphere absent oxygen.

14. The process according to claim 13, wherein heating said amorphous carbon in an inert atmosphere absent oxygen in step (b) comprises heating said amorphous carbon at a temperature greater than about 300° C for at least about 3½ hours.

15. The process according to claim 14, wherein heating said amorphous carbon in an inert atmosphere absent oxygen in step (b) comprises heating said amorphous carbon at a temperature between about 325° C and 425° C.

16. The process according to claim 15, wherein heating said amorphous carbon in an inert atmosphere absent oxygen in step (b) comprises heating said amorphous carbon at a temperature of about 410° C.

17. The process according to claim 13 wherein in step (a)(iii) applying said at least one lower adhesion-promotion barrier layer comprises applying a single layer that is both an adhesion-promotion and a barrier layer, and in step (c) applying said at least one upper adhesion-promotion barrier layer comprises applying a single layer that is both an adhesion-promotion and a barrier layer.

18. The process according to claim 13 wherein in step (a)(iii) applying said at least one lower adhesion-promotion barrier layer comprises applying a first lower layer that is a barrier layer and then applying a second lower layer that is an adhesion-promotion layer, and in step (c) applying said at least one upper adhesion-promotion barrier layer comprises applying a first upper layer that is an adhesion-promotion layer and then applying a second upper layer that is a barrier layer.

19. The process according to claim 12 further comprising the steps of:
(e) evacuating the fill, leaving gaps between said conductive lines; and
(f) filling said gaps with a dielectric material.

20. The process according to claim 13 further comprising the steps of:
(e) heating the amorphous carbon in the presence of oxygen to form a carbonaceous gas that dissipates, leaving gaps between said conductive lines; and
(f) filling said gaps with a dielectric material.

21. The process according to claim 12 further comprising the steps of:
(e) creating at least one layer above said lines and said fill;
(f) creating at least one pathway to said fill through said layer; and
(g) converting said fill to a gas that escapes through said pathway, leaving an air void between adjacent lines.

22. The process according to claim 13 further comprising the steps of:
(e) applying a cap layer;
(f) creating at least one cutout in said cap layer, each cutout creating an opening that exposes a portion of one of said conductive lines and a portion of the amorphous carbon adjacent to said conductive lines;
(g) applying a second layer of amorphous carbon over said cap layer, filling said cutouts;
(h) removing said second layer of amorphous carbon except in said cutouts, leaving patches of amorphous carbon;
(i) applying a second cap layer over said first cap layer and over said patches;
(j) creating at least one via in said second cap layer, each via penetrating to a patch in a portion that is over one of said conductive lines; and
(k) heating said substrate in the presence of oxygen to oxidize the amorphous carbon to a carbonaceous gas that escapes through each of said vias, leaving air voids between adjacent conductive lines.

23. The process according to claim 22 further comprising the steps of:
(l) applying a second conductive layer over said second cap layer and in said at least one via; and
(m) removing said second conductive layer except in said at least one via.

* * * * *